United States Patent

Kondur, Jr.

[15] 3,685,041

[45] Aug. 15, 1972

[54] DECIMAL TO BINARY ENCODER FOR GENERATING DECIMAL POINT POSITION AND ROUND-OFF INFORMATION IN A CALCULATOR

[72] Inventor: Nicholas Kondur, Jr., Northville, Mich.

[73] Assignee: Burroughs Corporation, Detroit, Mich.

[22] Filed: May 12, 1970

[21] Appl. No.: 36,589

[52] U.S. Cl. .........340/347 D, 340/347 DD, 340/357, 340/365

[51] Int. Cl. ..............................................G08c 9/04

[58] Field of Search.....340/347 DD, 347 P, 357, 365

[56] References Cited

UNITED STATES PATENTS

| | | | |
|---|---|---|---|
| 3,509,563 | 4/1970 | Boggs | 340/347 |
| 3,495,236 | 2/1970 | Mathamel | 340/347 |
| 3,426,346 | 2/1969 | Bose | 340/347 |
| 3,525,094 | 8/1970 | Leonard | 340/347 |
| 3,487,402 | 12/1969 | Hillhouse | 340/347 PR |
| 2,862,127 | 11/1958 | Maynard | 340/347 |
| 3,371,336 | 2/1968 | Bennett | 340/347 P |
| 3,540,036 | 11/1970 | Packard | 340/347 P |

*Primary Examiner*—Maynard R. Wilbur
*Assistant Examiner*—Jeremiah Glassman
*Attorney*—Charles S. Hall

[57] ABSTRACT

A decimal to binary encoder for generating both decimal point position and round-off information for instructing calculator memory register or printout logic. The encoder includes two sets of permanent magnets and associated reed switches, each switch having a binary value. An individual coded shunt plate containing variously shaped apertures is interposed between each set of magnets and its switches for permitting patterns of magnetic fields through the plate, thereby closing different combinations of switches depending on the position of each plate with respect to its set of magnets and switches. The positioning of the decimal point location shunt plate also positions the round-off shunt plate so that round-off is always made with respect to the decimal point location. The round-off setting is effected by positioning the round-off set of magnets and switches in relation to the previously positioned round-off shunt plate.

6 Claims, 8 Drawing Figures

INVENTOR
NICHOLAS KONDUR, Jr.
BY
ATTORNEY

INVENTOR

NICHOLAS KONDUR, Jr.

BY Charles S. Hall

ATTORNEY

INVENTOR

NICHOLAS KONDUR, Jr.

INVENTOR
NICHOLAS KONDUR, JR

DECIMAL TO BINARY ENCODER FOR GENERATING DECIMAL POINT POSITION AND ROUND-OFF INFORMATION IN A CALCULATOR

BACKGROUND OF THE INVENTION

This invention relates to a decimal to binary encoder for generating decimal point position information and round-off information in a calculator. The generated information when fed to the logic of the calculator causes the decimal point to be located at a given physical position in a register or printout, for example, and rounds off the decimals involved with respect to the locate of the decimal place.

In electronic calculators which perform such arithmetic functions as addition, subtraction, multiplication and division, it is necessary to provide decimal point location control in the memory registers and printout display so that those utilizing the calculator may not only rapidly perform calculations but also easily comprehend the information being printed out. Originally, calculators had full keyboards in which each digit position in the printout had associated therewith its own series of keys for feeding input information into the calculator. Each of these series of keys was aligned in a column on the keyboard. Thus, the decimal point location could be selected with respect to any one of the columns of keys associated with the respective digit positions, and all numbers being entered into the calculator through the keyboard were positioned by the operator with respect to this selected decimal point location.

However, many calculators being produced today utilize a ten-key keyboard which does not have a provision in the key arrangement for positioning the decimal point in the printout, since the keys on the keyboard are no longer aligned in columns associated with respective digit positions. Thus, the numbers in the registers and printout "float", that is, there is no established reference point about which the numbers in these locations are oriented. Thus, the need has become apparent for a device to position the decimal point in the registers of a calculator so that numbers being printed can be aligned with respect to an established decimal point location, thereby permitting an operator to easily comprehend the information being printed out. In addition, it is often desirable to provide a means for rounding off numbers being fed into a calculator and for rounding off numbers calculated from the input information. This is especially true where a chain of calculations is to be performed in binary code on a given set of input information. It is also desirable to be able to change the decimal point location from problem to problem and the round-off with respect to the decimal point.

While logic circuitry is known for utilizing binary information to locate a decimal place in a register or display unit and to round-off decimals in relation to the decimal point location, there has been no satisfactory keyboard device for encoding decimal instructions for such decimal point location and decimal round-off.

It is, therefore, an object of this invention to provide a mechanical decimal to binary encoder for furnishing both decimal point location and decimal round-off instructions to calculator logic.

It is another object of this invention to provide an economical, mechanically operated, binary switch utilizing magnetically operable switches to generate information as to decimal point location and decimal round-off relative thereto in binary form for instructing control logic in a calculator.

SHORT STATEMENT OF THE INVENTION

Accordingly, this invention provides a decimal to binary encoder for generating both decimal point position and round-off information in binary form, which encoder utilizes two sets of magnetic switches, each set having a series of defined positions with respect to an associated shunt plate. The first set of switches and its associated shunt plate generate information for indicating the physical position of the decimal point in the memory and output display of a calculator. The second set of switches and associated shunt plate generate information to indicate the number of insignificant decimal places to be rounded-off with respect to the decimal point position selected. The two shunt plates are connected for synchronous movement so that the position of the first shunt plate relative to the first set of magnetic switches establishes a reference position for the second coded shunt plate, the second set of magnets and switches being positionable with respect to the second coded shunt plate. The round-off information generated by the second set of switches and associated shunt plate is, therefore, a function of the decimal point position information generated by the first set of switches.

The various objects, advantages, and features of this invention will be come more fully apparent from the following detailed description, appended claims, and accompanying drawings in which:

DETAILED DESCRIPTION OF THE PREFERRED EMBODIMENT

Figure 1:
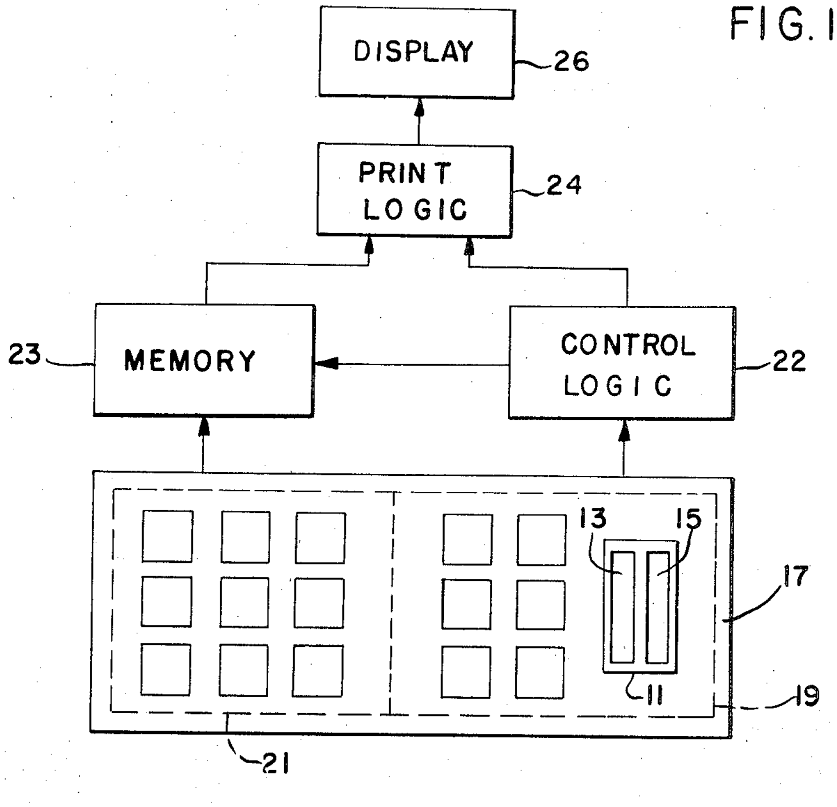
FIG. 1 is a block diagram of the decimal to binary encoder in an electronic calculator.

Referring now to FIG. 1, a decimal to binary encoder 11 having a decimal position selector 13 and a round-off selector 15 is located on a calculator keyboard 17 having an instruction section 19 and a numeric section 21. Instruction information is fed from the keyboard 17 to the control logic 22 of the calculator. Numeric information is entered into the calculator memory 23 from the numeric section 21 of the keyboard under instructions from the control logic 22. The factor being entered in the memory is oriented with respect to a physical decimal point location as instructed by data from the decimal point selector 13 and round-off selector 15. When a command is issued to perform a calculation, the calculator logic unit 22 controls the interaction of the information stored in the memory 23. The result of the calculation is sent to print logic 24 for controlling the display portion 26 of the calculator which may be of any form such as a printout wherein the information fed into the calculator and the result of the calculation are printed on a paper web.

Figure 2:
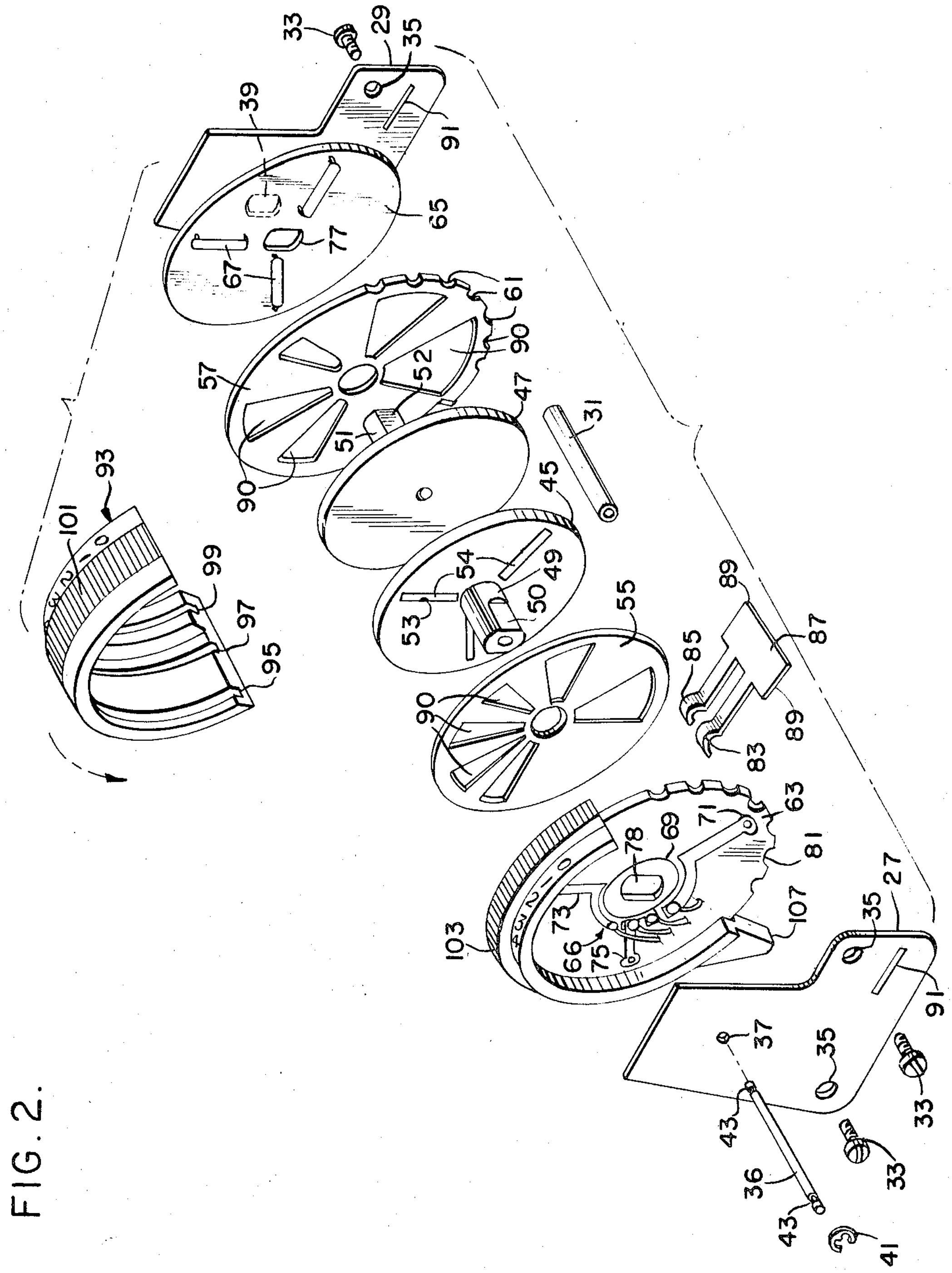
FIG. 2 shows an exploded view of the decimal to binary encoder of this invention.

Refer now to FIG. 2 which is an exploded view of the preferred embodiment of the decimal to binary encoder of this invention. Positioned at each end of the encoder are side supports 27 and 29 which may be of any material, such as metal, that is sufficiently tough and rigid to support the elements of the encoder. Two internally threaded spacer shafts 31 (see also FIGS. 5 and 6) space and secure the side supports 27 and 29 in position. Machine screws 33 are inserted through holes 35 in the side supports 27, 29 and are threaded into the shafts 31. An axle 36 is inserted through holes 37 and 39 in the side supports. Cotter rings 41 are clasped about grooves 43 in axle 36 to secure the axle in position.

Two insulators 45, 47 each having an elongated collar portion 49, 51 with key positions 50, 52 respectively, are mounted on the axle 36. Each insulator 45, 47 has in one surface three radially disposed, rectangular shaped depressions 53 situated at substantially 120° intervals. The depressions in insulator 45, as shown in FIG. 2, face toward side support 27. The depressions in insulator 45 (FIG. 4) face toward side support 29. The material forming the insulators 45, 47 in the preferred embodiment is a rigid, light weight, plastic but it is understood that any non-magnetic material can be used which is light weight and retains its shape satisfactorily.

Figure 4:
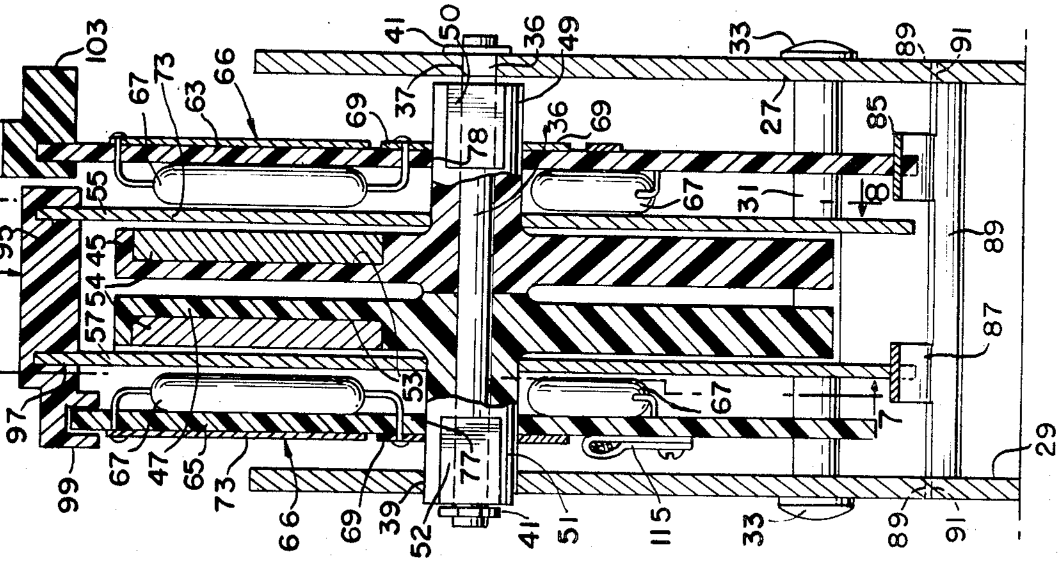
FIG. 4 shows a section view through line 4—4 of FIG. 3.

A permanent magnet 54, as shown in FIG. 4, is inserted in each of the depressions and is secured therein by means of an adhesive compound. Coded magnetic shunt plates 55, 57 are each mounted, respectively, over the collar portions 49, 51 of the insulators 45, 47. Each coded plate has a plurality of generally pie-shaped holes 90 therethrough with each of the apertures having a particular size and configuration which conform to the requirements of a predetermined code. In addition, shunt plate 57 has a plurality of indentations 61 spaced about a portion of its periphery.

Mounted next to each coded shunt plate 55, 57 is a disc 63, 65 having a printed circuit, numbered generally as 66, mounted on one side thereof and three radially oriented reed switches 67 (FIG. 4) mounted on the other side. As shown in FIG. 2, disc 65, having a keyed aperture 77 through the center thereof, is mounted next to shunt plate 57 and over the keyed collar portion 52 of insulator 47. The mate between keyed collar 52 and keyed aperture 77 locks insulator 47 to disc 65. Reed switches, collectively designated by numeral 67 and individually designated by $2^0$, $2^1$, and $2^2$ (FIGS. 7 and 8) are mounted at substantially 120° intervals with respect to each other. Each reed switch 67 has a pair of leads which pass through the disc 65 to the other side and terminate in the printed circuit 66 bonded thereto.

At the opposite end of the encoder is the second disc 63 having a keyed aperture 78 through the center thereof, which disc is mounted next to shunt plate 55 and over the keyed collar portion 50 of insulator 45. Movement of insulator 45 is locked to movement of disc 63 because of the mating of keyed aperture 78 and the keyed collar portion 50. Disc 63 also has a printed circuit 66 bonded thereto, which will be described in detail with respect to FIGS. 3 and 4.

Insulating disc 63, additionally, has a plurality of indentations 81 spaced about a portion of its periphery. The indentations 81 on disc 63 and the indentations 61 on coded shunt plate 57 mesh with the arcuate end portions 83, 85, respectively, of spring 87. The flanged ends 89 of spring 87 slide into slots 91 in each of the side supports 27, 29, securing the spring in place. The arcuate end portions 83, 85 of the spring 87 maintain reed switch-bearing disc 63 and coded shunt plate 57 in selected positions.

A cylindrical dial plate 93 is fixedly secured over coded shunt plates 55, 57 which fit into grooves 95, 97, respectively, in the interior of the dial plate. Thus, movement of coded shunt plate 57 is synchronized with movement of shunt plate 55 when dial plate 93 is rotated. Disc 65 slidably rotates in groove 99 of dial plate 93. The exterior of the dial plate 93 has a knurled portion 101 for insuring a good grip when rotated by the operator. The right side of the dial plate, for example, may have numbers marked thereon for indicating to the operator the decimal position being selected.

The round-off portion of the encoder has a dial plate 102 which is fixedly secured about the periphery of insulator 63. Dial plate 103 has a knurled portion 105 (FIGS. 3 and 5), for insuring a good grip when manually rotated by the operator. In addition, a motion-limiting detent 107 is provided on dial 103 which prevents dial 103 and insulator 63 from being rotated past a given point. The function of detent 107 will be explained hereinafter. On the left side of dial plate 103 (as shown in FIG. 2) may be marked numbers which indicate to the operator the round-off value being dialed.

Figure 3:
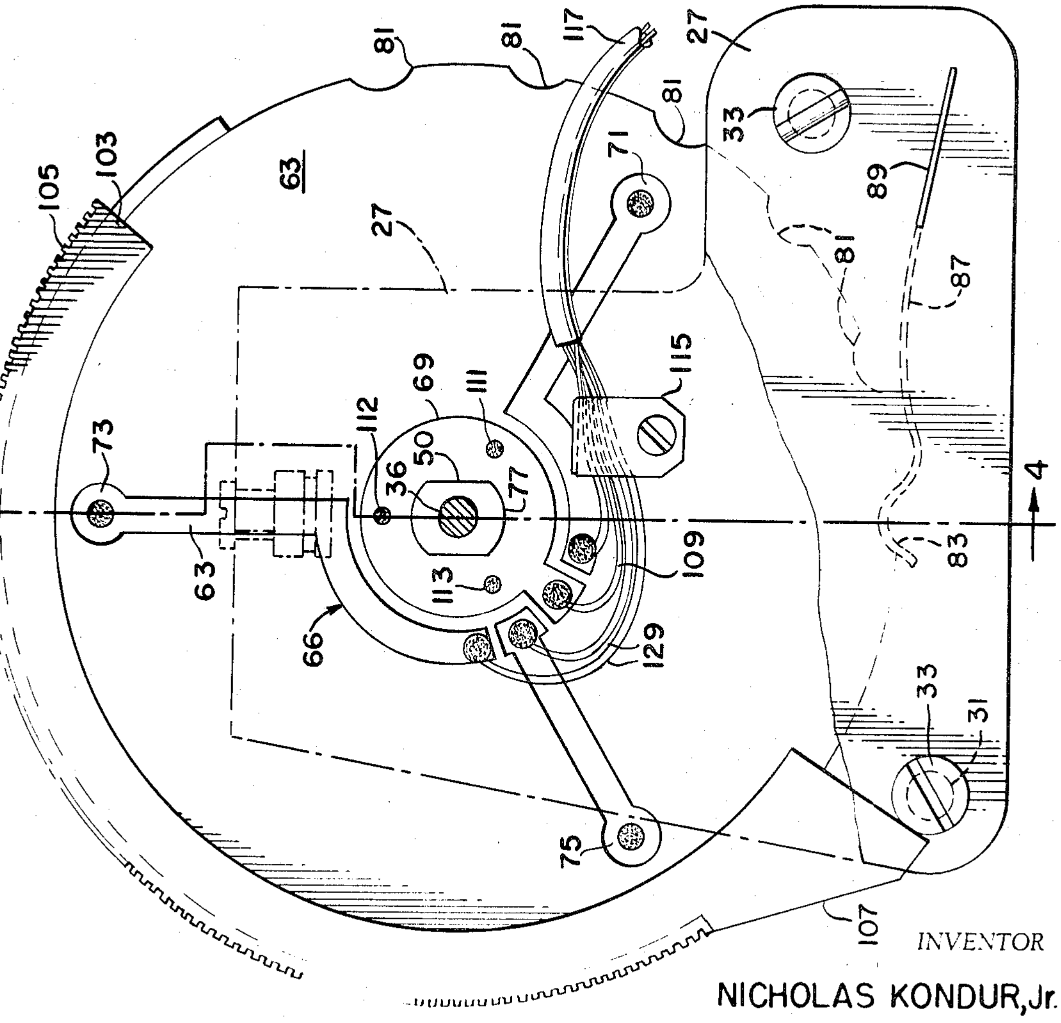
FIG. 3 shows an end view of the decimal to binary encoder of this invention.

Refer now to FIG. 3 which shows an end view of the encoder. Shown partially cut away is side support 27 having the machine screws 33 and flange 89 of spring 87 mounted therethrough. The keyed collar portion 50 of insulator 45 is shown mounted on axle 36 and reed switch-bearing insulator 63 is shown mounted on the keyed collar 50. The indentations 81 on disc 63 are shown for meshing with the arcuate end portion 83 of spring 87. Thus, when the round-off dial plate 103 is rotated by the operator, disc 63 rotates against the action of spring 87 until the arcuate end 83 of the spring comes to rest in a different indentation 81.

Bonded into disc 63 is the printed circuit 66 having a common path 69 and three separate paths 71, 73 and 75. Three reed switches 67 are mounted on the opposite side of the disc 63 (FIG. 4). The leads of the reed switches nearest to the axle 36 terminate in common path 69 when inserted through the insulator 63, the connections to the common printed circuit path being shown at 111, 112 and 113. The other ends of the reed switches are terminated, respectively, in paths 71, 72 and 75. Current enters printed circuit path 69 from lead 109 and passes through each closed reed switch 67 and then enters the printed circuit paths 71, 73 or 75 associated with the closed reed switches. Current will then flow through one or more of the above-mentioned paths 71, 73 or 75 through the respective output leads 129 connected thereto and into the control logic 22. In order to secure the leads 109 and 129 in place, a harness clamp 115 is fastened to disc 63. The leads 109 and 129 pass through the harness and into sheaf 117 which groups the input and output wires to conserve space.

Detent 107 is an extension on dial 103 and limits the counter-clockwise rotation of dial 103 by abutting against spacer 31.

Refer now to FIG. 4 which shows a sectional view through line 4—4 of FIG. 3. Axle 36 is shown journaled in side supports 27 and 29. As shown in this drawing, the aperture 39 in side support 29 is larger than aperture 37 in support 27 so that the keyed collar portion 52 of insulator 47 can fit therethrough. Aperture 39 has a keyed configuration which mates with keyed collar 52 thereby locking both disc 65 and insulator 47 in a stationary position. Aperture 37 receives axle 36 but not keyed collar 49, so that insulator 45 and disc 63 are rotatable with respect to side support 27. Each of the insulators 45, 47, shown aligned back to back, has three permanent magnets 54 mounted therein, which face toward the side supports 27, 29, respectively. Adjacent each insulator 45, 47 on the non-keyed portion of their collars are mounted coded shunt plates 55, 57, with each shunt plate being fixedly secured to the decimal position dial plate 93, as previously discussed. Reed switch-supporting insulating disc 65 has printed circuit paths 69, 71, 73, 75, bonded thereto (only 69, 73 being shown). The reed switch 67 shown on the upper portion of disc 65 has one terminal wire passing through a hole near the center of the insulator for making an electrical, as well as mechanical, contact with printed circuit 69 while the other terminal wire passes through a hole in the insulator near its outer periphery to make contact with conductor 73. In like manner, reed switch-bearing insulator 63 is shown having a reed switch 67 attached thereto by means of leads which extend through the insulator and are soldered with bonded conductors 69, 73 on the external surface of the insulator.

Figure 5:
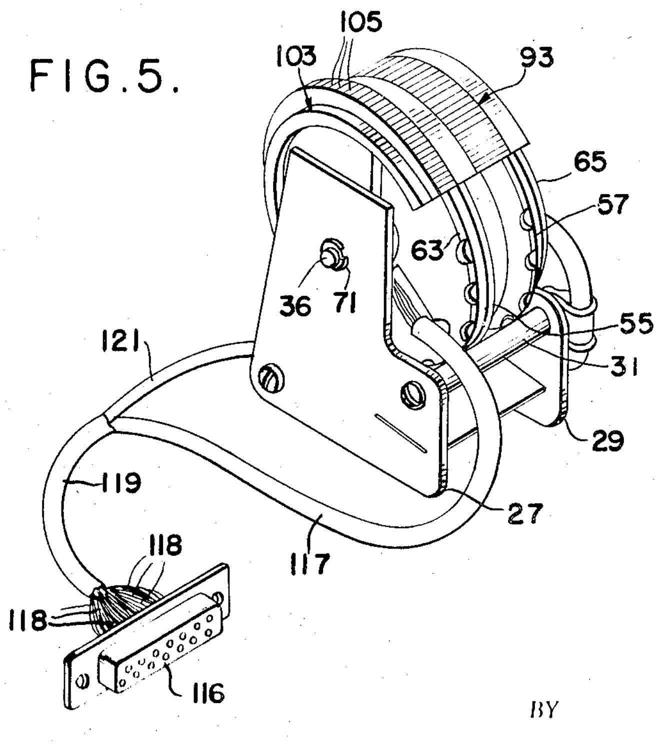
FIG. 5 is a perspective view of a physical embodiment of the present invention.

Referring now to FIG. 5, power is fed into and out of the encoder through a female terminal connector 116. Leads 118 are grouped in a first tubular skin 119 with a portion of the leads going to the round-off selector 15 through tubular skin 117 and a portion going to the decimal point selector 13 through tubular skin 121. Dial plates 93, 103 provide manually settable means for the operator to change the decimal position or alter the number of digits to be rounded off. The encoder may be mounted on the keyboard of a calculator such that portions of the dial plates 93, 103 are above the surface of the front panel. The operator is then able by finger action to rotate the dial plates as desired to effect the positioning of a decimal point or rounding off of a decimal.

In operation, a signal of constant potential is fed to each of the reed switches 67 mounted on the insulating discs 63, 65. Depending on the position of the coded shunt plates 55, 57 with respect to the magnets 54 embedded in insulators 45, 47, the state of each of the reed switches may be opened or closed. When a reed switch 67 is closed due to the magnetic field from bar magnets 54, current will flow therethrough from common circuit path 69 to the associated printed circuit path 71, 73, or 75. This current is delivered by one of the output leads 129, as shown in FIG. 3, through terminal connector 116 to the control logic 22.

Figure 6:
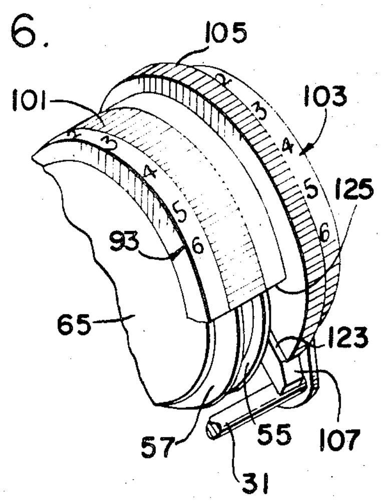
FIG. 6 is a detail view of the interlock of the manual dials of the encoder.

FIG. 6 shows the interlocking surfaces on the manual dials 93, 103 which prevent the round-off of numbers to the left of the decimal point location setting of the decimal point position selector 13. Detent 107 is an extension of dial 103, as previously stated, and limits the counter-clockwise movement of this dial (clockwise as shown in FIG. 6) by abutting against spacer shaft 31. In this position, as shown in FIG. 6, the numeral 0 would be indexed on the keyboard 17.

Detent 107 has a greater width than the dial 103 providing a shoulder 123 in the path of movement of decimal point position selector dial 93. When the dial 93 is rotated clockwise (as shown in FIG. 6) the lower edge 125 of the dial 93 will eventually abut the shoulder 123 from which point the two dials 93, 103 must rotate together, if at all, to the limit of their movement.

When detent 107 rests against spacer 31 and dial 93 rests against shoulder 123 of detent 107 the numerals "0" on both dials will be aligned. Such an alignment indicates that the decimal point is to be located at the extreme right side of the selected register and that there is no round-off. Due to the interaction of the portion 125 of the lower edge of the dial 93 and the shoulder 123, the dial 103 could not be advanced without advancing the decimal point location dial 93.

If the decimal point location selector 93 is advanced one step to "1", the round-off selector dial can also be advanced one step to "1", but no farther without also advancing dial 93. Thus, the round-off cannot go to the left farther than the decimal point position. On the other hand, the round-off selection can be made to retain any number of significant figures between the location selected for the decimal place and the right side of the selected register.

If the decimal dial 93 is rotated back toward "0" and the round-off dial 103 is positioned beyond zero, the interaction of surface 125 on dial 93 and shoulder 123 of detent 107 must also force the round-off dial back toward the "0" position.

Since both shunt plates 55, 57 are fixed to the dial 93 and the permanent magnets 54 and reed switches 67 of the round-off selector 15 are locked to the round-off selector dial 103, it is apparent that the number of decimal places to be retained in a factor being entered in a register is always in relation to the decimal point location and the rounding off cannot be carried to the left of the decimal point location.

In the preferred embodiment the numerals on the round-off dial indicate the number of significant decimals to be retained, whereas the output of the round-off section of the encoder provides the number of decimal positions to be rounded off, i.e., the number of positions from the right hand side of the selected register which will indicate zero.

Since the decimal point is positioned with respect to a fixed point such as the right side of the register, its position may be denominated as 0, 1, 2, 3, etc., meaning: at the extreme right, to the left of the first, second, third, etc., digit location from the right side, respectively. If, then, the decimal point position, as shown on dial 103, is called RO, the output of the round-off section 15 of the encoder, in the preferred embodiment, can be stated as DP–RO. In no event, however, can this difference be negative, as explained in connection with FIG. 6.

In some logic configurations it is desirable for the output of the decimal point selector to be the binary equivalent of DP + 1, in which case the output of round-off selector would be the binary equivalent of DP–RO + 1. It is apparent, of course, that the output of the round-off selector could also be the binary equivalent of the number of decimal places to be retained, if desired, in which case the control logic would determine the number of places to be rounded off.

Figure 7:
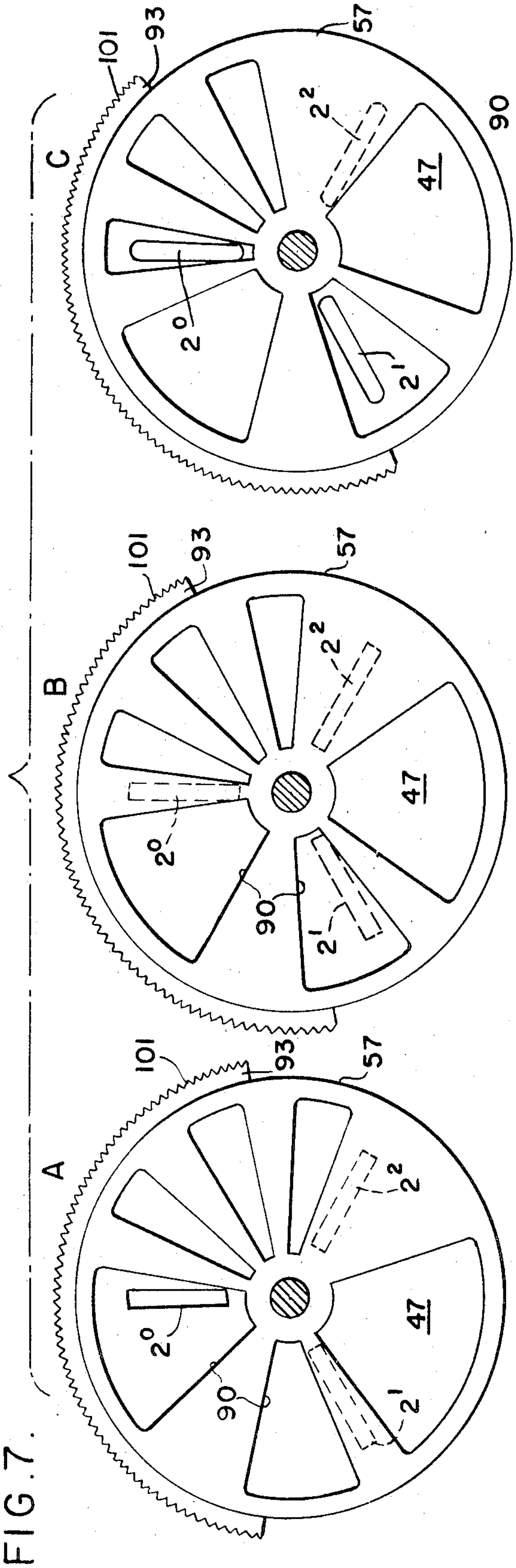
FIG. 7 shows a series of lateral views of the decimal select shunt plate and the magnet-bearing insulator of the decimal selector portion of the encoder taken along line 7—7 of FIG. 4.

Refer now to FIG. 7, which shown the coded shunt plate 57 and the magnet-bearing insulator 47 of the decimal point selector 13 taken along line 7—7 of FIG. 4. Dial plate 93, having the knurled portion 101, is shown mounted on coded shunt plate 57. Three permanent magnets 54 designated by binary $2^0$, $2^1$, and $2^2$ are embedded in insulator 47. FIG. 7A shows the relative positions of the coded shunt plate 57 and the permanent magnets 54 when the decimal position selected is one, that is, when the decimal is to be positioned at the left of the first digit on the right hand side of a register of the calculator. The magnetic fields emanating from the bar magnets $2^1$ and $2^2$ are shielded and the magnetic field from the $2^0$ magnet is not. Therefore, the read switch representing the binary $2^0$ digit position will be closed and current will flow therethrough to the output.

If it were desired that there be no decimal places, i.e., that the decimal point be placed at the extreme right side of the register, the decimal dial would be set at "0". The shunt plate 93 and the magnet-bearing insulator 47 would then be positioned so that all the magnets 54 were shielded. Such positioning with respect to shunt plate 55 and magnet-bearing insulator 45 is shown in FIG. 8A.

In FIG. 7B the dial plate 93 has been advanced to position "2" indicating that the decimal position selected is to be to the left of the second digit position in a calculator register, for example. The pie-shaped holes 90 in the shunt plate 57 are now rotated one step in the counter-clockwise direction. Thus, the magnets $2^0$, $2^2$ are shielded while the magnet $2^1$ is not. Therefore, the read switch representing the binary $2^1$ digit position is closed and current will pass therethrough to the output.

FIG. 7C shows the position of the coded shunt plate 57 and magnet-bearing insulator 47 when the decimal position selected is "3". The coded shunt plate 57 is now rotated one step farther in the counter-clockwise direction. Magnets $2^0$ and $2^1$ are not shielded and magnet $2^2$ is shielded. Thus, the reed switches representing the $2^0$ and $2^1$ binary digit positions are closed allowing current to flow therethrough to the output. In response to this output, the decimal point will be positioned to the left of the third digit position in the register. Thus, as the dial plate and consequently the coded shunt plate are continuously advanced, certain ones of the reed switches will be closed so that the decimal point positions in the output will continuously move to the left to a maximum of six for the configuration shown.

Figure 8:
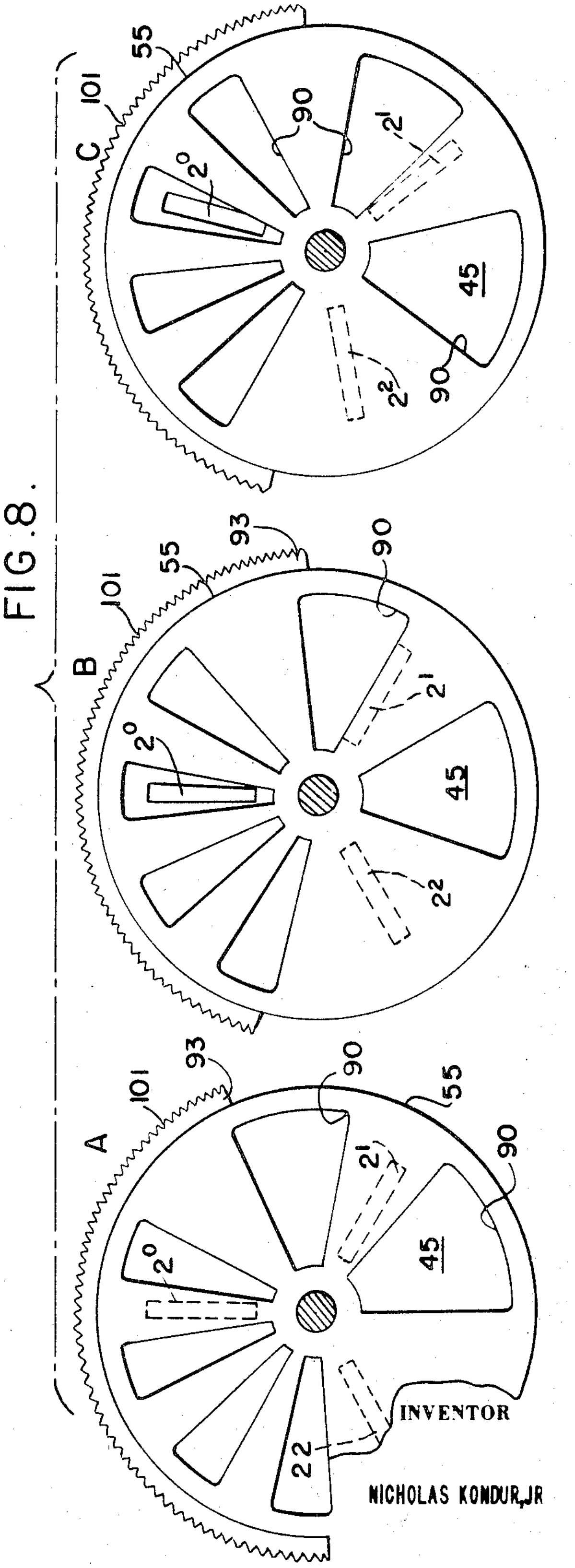
FIG. 8 shows a series of lateral views of the round-off shunt plate and the magnet-bearing insulator of the round-off selector portion of the encoder taken along line 8—8 of FIG. 4.

Refer now to FIG. 8, which shows the round-off shunt plate 55, and the magnet-bearing insulator 45 of the round-off selector portion of the decimal to binary encoder taken along line 8 — 8 of FIG. 4. Permanent bar magnets designated $2^0$, $2^1$, and $2^2$ are shown embedded in the insulator 45 and pie-shaped holes 90 are shown in the coded shunt plate 55.

FIG. 8A shows the relative positions of the coded shunt plate 55 and insulator 45 when the decimal point location value selected is "0" and the round-off value must be "0", which means that the decimal point position is at the extreme right of the register and no digits can be rounded off in the output. Thus, as shown, each of the bar magnets in the insulator 45 is shielded from its respective reed switch and no current is conveyed to the output of the encoder.

FIG. 8B shows the relative positions of the shunt of plate and bar magnets of the round-off selector when the decimal position selected is one and the round-off dial is still set at "0", meaning that no decimals are to be retained. It can be seen that the coded shunt plate 55 has been rotated one step in a clockwise direction as shown in the figure. As explained above, this follows since this shunt plate 55 and the decimal selector dial plate 57 are mechanically linked together. Thus, magnet $2^0$ is no longer shielded where as magnets $2^1$ and $2^2$ are shielded, thus, the reed switch representing the "1" digit position is closed allowing current to flow therethrough to the output of the encoder. The rightmost digit will be rounded off leaving a zero in the rightmost digit location in the register.

In FIG. 8C the relative positions of the coded shunt plate 55 and insulator 45 are shown when the decimal point position selected is "2" and the round-off value selected is advanced from "0" to "1", instructing that the decimal number entering the register be rounded off to one significant figure. Since the movement of the bar magnets in insulator 45 is keyed to the movement of disc 63, the bar magnets are rotated one step in the clockwise direction. The bar magnets, $2^1$ and $2^2$ are now shielded while the bar magnet $2^0$ or decimal "1". This output is fed to the calculator logic which sets the first digit position from the right in the register at zero. Thus, with the decimal point position to the left of the second digit position and the round-off dial set to retain one decimal digit, only the first digit position from the right is rounded off to zero.

I claim:

1. An encoding device comprising:

a plurality of means for generating a first set of individual magnetic fields, said means being radially arranged in a first plane;

a like plurality of means responsive to individual ones of said fields for completing circuit paths, said responsive means being arranged in a second plane opposite said first plane, and each of said circuit paths having a distinct value assigned thereto;

first shunting means having a plurality of shaped apertures therethrough, said apertures being individually proportioned for selectively shunting single ones and predetermined groups of said first set of magnetic fields to form a first progression of values;

said generating and responsive means and said first shunting means being relatively positionable by rotation;

a second plurality of means for generating a second set of individual magnetic fields;

a like second plurality of means responsive to individual ones of said second set of magnetic fields for completing a second set of circuit paths, each of said second set of circuit paths having a distinct value assigned thereto; and second shunting means having a plurality of shaped apertures therethrough, said apertures in said second shunting means also being individually proportioned for selectively shunting single ones and predetermined groups of said second set of magnetic fields to form a second progression of values;

said second shunting means being secured to said first shunting means in synchronized relationship wherein said second progression of values is a function of said first progression of values.

2. The device of claim 1 wherein said means for generating said first and second sets of magnetic fields are permanent magnets and said circuit completing means are reed switches.

3. The device of claim 1 wherein said first shunting means is settable in a first series of positions, said second field generating means and means responsive to said second fields are locked together and settable in a second series of positions each of said series of positions being representative of decimal values and wherein said first and second progressions of values are representative of binary values.

4. The device of claim 3 wherein said first progression of values is the binary equivalent, respectively, of the decimal values represented by first series of positions, and wherein said second progression of values is the binary equivalent of the difference between the decimal values represented by individual ones of said first series of positions and said second series of positions, respectively.

5. In an electronic digital calculator having a memory, control logic and a keyboard including means for indexing numeric data and means for instructing said control logic as to processing said numeric data, a decimal to binary encoder for instructing said control logic as to the physical location in the memory of a decimal point in a factor being entered into said memory and the round-off of decimal digits with respect to said decimal point location comprising:

first and second means for generating first and second sets of magnetic fields, respectively, first and second means individually responsive to individual ones of said first and second generating means, respectively, to complete first and second sets of circuit paths, said generating means and and responsive means being respectively radially arranged on opposing surfaces, first and second shunting means interposed, respectively, between said opposing surfaces, said shunting means having shaped apertures therethrough for selectively shunting said fields, said shunting means being locked together for synchronous movement, means for setting said first shunting means in a series of digital positions representative of a progression of decimal point locations, means for setting said second generating means and said second responsive means with respect to said second shunting means, in a series of positions representative of a progression of numbers of decimal digits to be retained with respect to the selected location of the decimal point, and wherein said apertures in said first shunting means are shaped to combine said first set of circuit paths in a progression of binary values equivalent to the respective values represented by said digital positions of said decimal point locations, and said apertures in said second shunting means are shaped to combine said second set of circuit paths in a progression of binary values equivalent to the respective differences between the values represented by said digital positions of said decimal point locations and the value represented by the individual ones of the progression of decimal digits to be retained with respect to the selected location of the decimal point.

6. In the electronic digital calculator claim 5, the decimal binary encoder thereof also including interlocking means interacting between said means for setting said first shunting means and said means for setting said second generating means and said second responsive means for preventing said respective differences from becoming negative.

* * * * *